United States Patent [19]

Murakami et al.

[11] Patent Number: 4,860,374
[45] Date of Patent: Aug. 22, 1989

[54] APPARATUS FOR DETECTING POSITION OF REFERENCE PATTERN

[75] Inventors: Seiro Murakami, Tokyo; Akikazu Tanimoto; Susumu Makinouchi, both of Yokohama; Hidemi Kawai, Kawasaki; Masaichi Murakami, Tokyo, all of Japan

[73] Assignee: Nikon Corporation, Tokyo, Japan

[21] Appl. No.: 218,503

[22] Filed: Jul. 6, 1988

Related U.S. Application Data

[63] Continuation of Ser. No. 723,307, Apr. 15, 1985, abandoned.

[30] Foreign Application Priority Data

Apr. 19, 1984 [JP] Japan .................................. 59-79061
Apr. 24, 1984 [JP] Japan .................................. 59-82453

[51] Int. Cl.$^4$ ............................................. G06K 9/20
[52] U.S. Cl. ......................................... 382/48; 382/8; 356/375
[58] Field of Search .............. 382/8, 48, 61; 358/101, 358/107; 356/375; 307/351

[56] References Cited

U.S. PATENT DOCUMENTS

| | | | |
|---|---|---|---|
| 3,292,096 | 12/1966 | Deneen, Jr. .......................... | 307/351 |
| 3,768,910 | 10/1973 | Zanoni ................................. | 356/375 |
| 3,898,617 | 8/1975 | Kashioka et al. ....................... | 382/8 |
| 4,045,141 | 8/1977 | Moriyama ............................. | 356/401 |
| 4,115,762 | 9/1978 | Akiyama ................................. | 382/8 |
| 4,213,117 | 7/1980 | Kembo et al. .......................... | 382/8 |
| 4,253,112 | 2/1981 | Doemens ................................ | 382/8 |
| 4,297,676 | 10/1981 | Moriya ................................... | 382/8 |
| 4,423,959 | 1/1984 | Nakazawa et al. .................. | 356/400 |
| 4,430,750 | 2/1984 | Koellensperger ...................... | 382/8 |
| 4,475,122 | 10/1984 | Green ...................................... | 382/8 |
| 4,607,333 | 8/1986 | Yasutake .............................. | 364/490 |

*Primary Examiner*—Leo H. Boudreau
*Assistant Examiner*—Jose L. Couso
*Attorney, Agent, or Firm*—Shapiro and Shapiro

[57] ABSTRACT

An apparatus for detecting a position of a reference pattern or mark formed in a substrate to be aligned with a photomask pattern performs the following functions: scanning a reference pattern having at least two edges and generating a time-serial pattern signal corresponding to the scanned pattern; extracting all scanning positions at which a waveform of the pattern signal has a shape corresponding to an edge of the pattern within a predetermined scanning range including the pattern; selecting one pair from all possible pairs of a plurality of extracted scanning positions in accordance with a degree to which a pattern signal between the two scanning positions defined by each pair satisfies predetermined waveform conditions; and determining as a pattern position a predetermined position at which the interval between the two scanning positions of the selected pair is divided into two intervals by a predetermined ratio.

7 Claims, 9 Drawing Sheets

APPARATUS FOR DETECTING POSITION OF REFERENCE PATTERN

This is a continuation application of Ser. No. 723,307 filed Apr. 15, 1985, now abandoned.

BACKGROUND OF THE INVENTION

1. Field of the Invention

The present invention relates to an apparatus for detecting a position of a reference pattern or mark formed in a substrate to be aligned with a photomask pattern. More particularly, the present invention relates to a pattern position detection apparatus which can be suitably adapted in a wafer alignment apparatus; in a semiconductor device manufacturing apparatus such as an optical exposure apparatus, an X-ray exposure apparatus, an electron beam exposure apparatus, etc. and or a scanning electron microscope.

2. Description of the Prior Art

Among various types of semiconductor manufacturing apparatuses, an exposure apparatus (aligner or stepper) for transferring a pattern of a photomask or a reticle to a semiconductor wafer must be able to perform correct alignment of the photomask with the wafer. For this type of alignment, a small wafer mark is generally formed in the wafer to be aligned, and a mask mark to be aligned with the wafer mark is also formed in the photomask. The exposure apparatus observes the mask and wafer marks from the side of the photomask through a microscope, photoelectrically detects images of the two marks, and automatically corrects a relative positional deviation between the two marks. With the apparatus of this configuration, the wafer mark is a single linear pattern, which is photoelectrically scanned in a direction to cross the two side edges of the mark. The central position between the side edges is detected using an image signal corresponding to the mark, and the central position is defined as the mark position.

An example of such a method is disclosed in U.S. Pat. No. 4,115,762, wherein symmetrical pattern matching is performed using an image signal. This method is based on the principle that when an image signal is returned from the central point between two edges of a mark, optimal matching can be achieved. In general, a photoresist for exposure purposes is coated on the wafer surface to a thickness of about 0.5 to 2 $\mu$m. However, the photoresist coating has an irregular thickness near the mark which forms an uneven pattern. For this reason, when the mark is illuminated with monochromatic light during observation through the microscope, a plurality of parallel interference fringes are formed near the edges of the mark. If the interference fringes are symmetrical at the two sides of the mark, the mark position can be detected with a satisfactory precision by conventional symmetrical pattern matching. However, when a photoresist is coated on the wafer surface by a spin coater or the like, due to the centrifugal force, the photoresist thickness may not symmetrically change at the edges (stepped portions) of the mark and non-symmetrical interference fringes may be formed. This degrades the symmetry of the overall image signal and also means that processing depending on symmetry only may result in mark position detection of low precision.

SUMMARY OF THE INVENTION

It is an object of the present invention to provide an apparatus which is free from the drawbacks of the conventional apparatuses and which can detect with high precision a position of a reference pattern formed on an object for high-precision alignment thereof.

In order to achieve the above object of the present invention, there is provided according to the present invention an apparatus comprising means for scanning a reference pattern for alignment having at least two edges and for generating a time-serial pattern signal corresponding to the scanned pattern; means for extracting all scanning positions at which a waveform of the pattern signal has a shape corresponding to an edge of the pattern within a predetermined scanning range including the pattern; means for selecting one pair from all possible pairs of a plurality of extracted scanning positions in accordance with a degree to which a pattern signal between the two scanning positions defined by each pair satisfies predetermined waveform conditions; and means for determining as a pattern position a predetermined position at which the interval between the two scanning positions of the selected pair is divided into two intervals by a predetermined ratio.

According to an aspect of the present invention, an image signal which represents a characteristic waveform such as a bottom or a slope at an edge of a reference pattern is formed, and a differential signal obtained by differentiating the image signal is also formed. Pairs (P) and (P') of scanning positions which optimally satisfy predetermined waveform conditions are selected for the image and differential signals, respectively. One of the selected pairs (P) and (P') is selected in accordance with the relationship between the characteristic feature of the image signal and that of the differential signal.

In accordance with another aspect of the present invention, a templet storing a standard waveform of a pattern signal is used to select one pair of scanning positions. When a judgement is made whether the predetermined waveform conditions are satisfied, the waveforms of each pattern signal and the templet are superposed on each other and a correlation is calculated so as to align the central position between each of the paired scanning positions with the central position between the two edges of the templet, and a pair of scanning positions which provides an optimal correlation is detected. The correlation calculation is performed for a pair of scanning positions which has an interval therebetween substantially equal to the interval between the two edges of a reference pattern.

According to still another aspect of the present invention, in order to allow correct detection of the original reference pattern even if the reference pattern is nonsymmetrical, a nonlinear amplifier or a waveform shaper is included so as to reduce distortion in the image signal obtained by scanning the reference signal, the distoration being included due to nonsymmetry of the reference pattern.

DETAILED DESCRIPTION OF THE PREFERRED EMBODIMENTS

Figure 1:
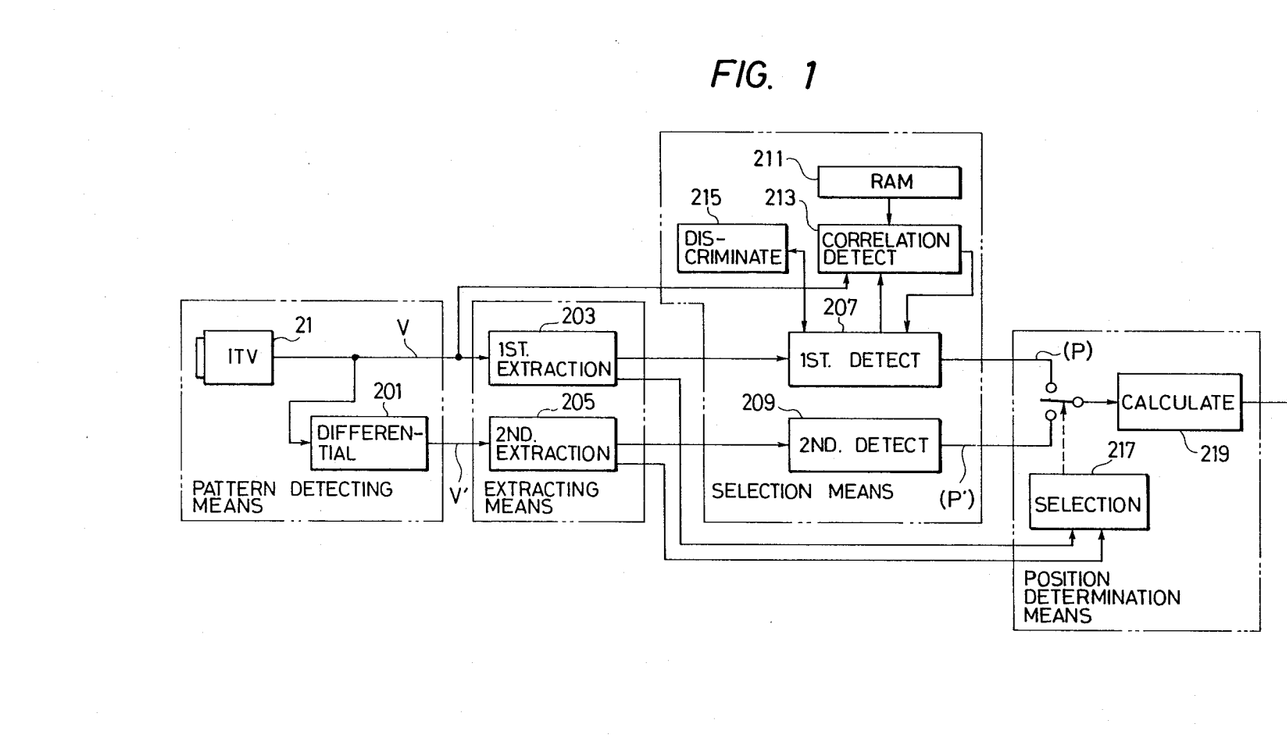
FIG. 1 is a block diagram showing the configuration of an apparatus according to the present invention.

FIG. 1 shows a functional block diagram of the apparatus according to the present invention. A pattern detecting means has an image detect portion 21 such as an ITV for scanning a reference pattern of an object and outputting a corresponding image signal V, and a differential portion 201 for forming a differential signal V' obtained by differentiating the image signal V. An extracting means has a first extraction portion 203 for extracting scanning positions representing a characteristic feature of an edge of the reference pattern from the image signal V, and a second extraction portion 205 for extracting scanning positions representing the characteristic feature from the differential signal V'. A selection means has a first detect portion 207 for detecting one pair (P) of scanning positions from the scanning positions extracted by the first extraction portion 203, and a second detect portion 209 for detecting one pair (P') of scanning positions from the scanning positions extracted by the second extraction portion 205. Each of the detect portions 207 and 209 selects one pair among all possible pairs of extracted scanning positions which optimally satisfies predetermined conditions.

The selection means further has a RAM 211 for storing as a templet a standard waveform of the image signal V, a correlation detect portion 213 and a discriminate portion 215. When a judgement is made whether the predetermined waveform conditions are satisfied, the correlation detect portion 213 superposes the waveform of the image signal with the templet and performs a correlation calculation such that the central position between the two paired scanning positions is aligned with the central position between the two edges of the templet, and detects one pair of scanning positions which gives an optimal correlation. Before the correlation calculation, the discriminate portion 215 selects pairs of scanning positions which have intervals substantially equal to that between the two edges of the reference patterns.

A position determination means comprises a selection portion 217 for selecting one of the pairs (P) and (P') of scanning positions in accordance with a correlation between the characteristic features of the image signal and the differential signal V' which are extracted by the extracting means, and a calculate portion 219 which determines as a reference pattern position a position which is obtained by dividing an interval between the two scanning positions of the selected pair into two by a predetermined ratio.

Figure 2:
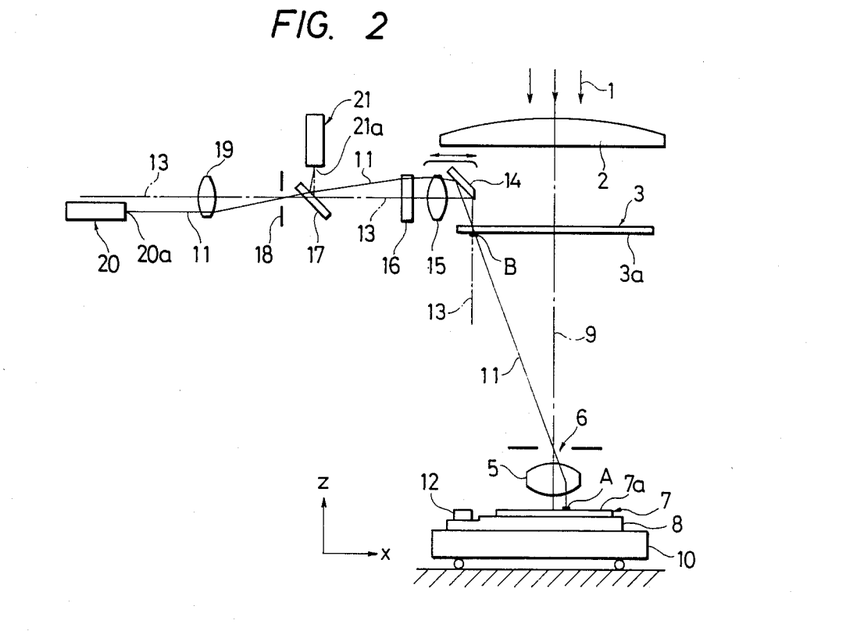
FIG. 2 is a diagram showing the schematic configuration of a projection exposure apparatus according to a first embodiment of the present invention.
Figure 3:
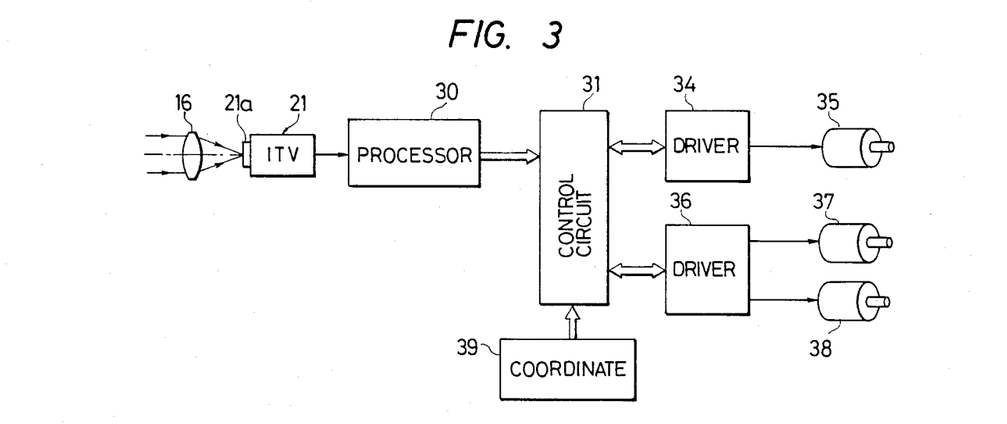
FIG. 3 is a block diagram of a control system in the apparatus shown in FIG. 2.

FIG. 2 shows the schematic optical arrangement of a reducing projection exposure apparatus according to an embodiment of the present invention, and FIG. 3 is a block diagram of a control system for controlling the exposure apparatus thereof.

Referring to FIG. 2, exposure light rays 1 from a light source (not shown) illuminate a reticle (photomask) 3 as a projection pattern through a main condenser lens 2. The main condenser lens 2 forms an image of the light source in an entrance pupil plane of a projection lens 5. A predetermined pattern is formed on a surface of the reticle 3 which is at the side of the projection lens 5, i.e., a pattern surface 3a. The pattern on the reticle 3 is reduced in size at a predetermined magnification and projected on a pattern surface 7a of a wafer 7. The exposure light rays 1 expose a photoresist coated on the pattern surface 7a of the wafer 7, and conveniently comprise single wavelength light such as light having a wavelength of 435.8 nm (g-lines) or light having a wavelength of 365 nm (i-lines) from a high-pressure mercury lamp.

In addition to the exposure optical system described above, an alignment optical system is incorporated so as to allow observation of the positional relationship between a reference mark A for alignment formed in the wafer and a reference mark B formed at a peripheral portion of the pattern surface 3a of the reticle. The alignment optical system uses the same light of single wavelength as illumination light. A reflecting mirror 14, a first objective lens 15 and a second objective lens 16 are arranged above the peripheral edge of the reticle. An optical axis 13 of the first objective lens 15 is bent at a right angle by the reflecting mirror 14 and is perpendicular to the pattern surface 3a of the reticle. Therefore, the optical axis 13 of the first objective lens 15 is substantially parallel to an optical axis 9 of the projection lens 5. The front focal point of the first objective lens 15 is on the pattern surface 3a. The first objective lens 15 and the reflecting mirror 14 can move together along the optical axis 13 while maintaining the above-described positional relationship. The first and second objective lenses 15 and 16 constantly comprise an afocal system. A stop 18 arranged at the rear focal point of the second objective lens 16 has a conjugated relationship with the pattern surface 3a with reference to the first and second objective lenses and also has a conjugated relationship with the pattern surface 7a of the wafer with reference to the projection lens 5. A condenser lens 19 is arranged behind the stop 18 for limiting the illumination region on the wafer. The focal point of the condenser lens 19 is aligned with the position of the stop 18. The condenser lens 19 is coaxially arranged with the optical axis 13 of the first and second objective lenses. An output surface 20a of a light guide 20 for supplying illumination light rays of a single waveform which are the same as the exposure light rays 1 has its center shifted from the optical axis 13. A beam splitter 17 is inserted between the stop 18 and the second objective lens 16. An image detection portion 21 such as an ITV is arranged in one optical path of the beam splitter 17. An imaging surface 21a of the ITV 21 has a conjugated relationship with the pattern surface 3a with respect to the first and second objective lenses 15 and 16 as in the case of the stop 18 and also has a conjugated relationship with the pattern surface 7a of the wafer 7.

With the apparatus of the above construction, the light rays from the light guide 20 are supplied to the marks A and B, and the images of the marks A and B are observed through the ITV 21.

Another alignment optical system consisting of elements 14 to 21 as described above is arranged in a direction perpendicular to the sheet of drawing of FIG. 2. The two alignment optical systems serve to detect a two-dimensional positional deviation between a reticle and a wafer.

In the apparatus of the construction shown in FIG. 2, the system between the reticle and the projection lens 5 is a non-telecentric optical system, and the system between the projection lens 5 and the wafer 7 is a telecentric optical system. In this case, if the mark on the reticle is arranged at a position not coinciding the optical axis 9 of the projection lens 5, i.e., at a position near the reticle, a main light ray 11 of the mark illumination light rays does not become perpendicular to the pattern surface 3a. For this reason, even if the mark B comprises a thin metal film having light reflectivity, reflected light from the mark does not return to the ITV 21 but is directed to another direction. Therefore, the mark is illuminated by light reflected from the wafer and transmits incident light. A dark image of the mark B is detected. In this manner, when the system at the side of the reticle is a non-telecentric optical system, the mark B can consist of a reflecting and light-shielding material or a light-absorbing material.

If the systems at both sides of the reticle and the wafer are telecentric, the main light ray 11 becomes perpendicular to the reticle. In this case, the mark B is made of a light-absorbing material. Alternatively, the reticle is illuminated with polarized light, and a member (e.g., a ¼ wave plate) for changing the polarization state is inserted in the optical path between the reticle and the wafer. Thus, a polarization/separation optical system is arranged wherein reflected light from the mark B is shielded but reflected light from the wafer is transmitted.

Referring to FIG. 2, the wafer 7 is drawn by suction to a wafer holder 8. A stage 10 is two-dimensionally movable (in orthogonal x- and y-directions) on a base. The wafer holder is placed on the stage 10 to move two-dimensionally therewith. The wafer holder is movable along the direction of the optical axis (z-direction) of the projection lens relative to the stage for the purpose of focus control. A reference mark which can be matched with the mark B of the reticle is formed on a reference mark plate 12, and is used for aligning the reticle and the stage. The surface portion of the reference mark plate 12 other than the mark has a predetermined reflectivity, and is fixed to the wafer holder 8.

Referring to FIG. 3, the densities of the images of the marks A and B which are formed by the second objective lens 16 are subjected to photoelectric conversion by the ITV 21, and corresponding image signals are supplied to a signal processor 30. The processor 30 processes the image signals, detects the contrast of the image formed on the imaging surface 21a, and supplies detection data corresponding to the relative positional deviation between the marks A and B to a control circuit 31. A motor 35 driven by a driver 34 moves the wafer holder 8 in the z-direction, and the amount of movement is controlled by drive data from the control circuit 31. Motors 37 and 38 driven by a driver 36 move the stage 10 in the x- and y-directions, respectively, and their amounts of movement are controlled by drive data supplied in accordance with detection data from the control circuit 31. The two-dimensional position of the stage 10, i.e., the coordinates on the orthogonal x-y coordinate system are sequentially detected by a coordinate measuring unit 39 using an interferometer or an encoder. The detected coordinates are processed by the control circuit 31 and are used for positioning of the stage 10.

Figure 4:
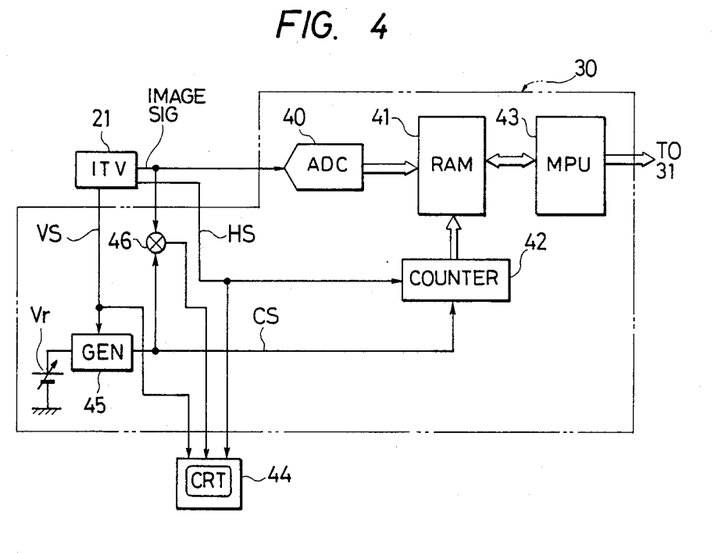
FIG. 4 is a block diagram of a signal processor shown in FIG. 3.

FIG. 4 shows a block diagram of the processor 30. The level of an image signal from the ITV 21 is converted into a digital value by an analog-digital converter (to be referred to as an ADC hereinafter) 40. The digital value from the ADC 40 is stored in a RAM 41. A horizontal period signal HS is produced from the ITV 21. In response to the horizontal period signal HS, a counter 42 generates 1,024 pulses during one scanning period and sequentially counts them so as to divide one scanning line into, e.g., 1,024 pixels. The count of the counter 42 is supplied as an address signal to the RAM 41, and the intensity level of each pixel of the image signal corresponding to one scanning line is sequentially stored at proper addresses of the RAM 41. A microprocessor (to be referred to as an MPU hereinafter) 43 controls the read/write operations of the RAM 41, and calculates the positional deviation between the marks A and B in accordance with image data stored in the RAM 41. The ITV 21 also generates a vertical scanning signal VS of sawtooth waveform for two-dimensional scanning. The vertical scanning signal VS is supplied to a cathode-ray tube (CRT) 44 together with the image signal and the horizontal period signal HS.

The CRT 44 displays the detected image, and also displays a horizontal cursor line at a predetermined position along the vertical direction of the screen. The cursor line is generated by a cursor signal generator 45 for generating a pulse-like cursor signal CS when a preset voltage Vr corresponding to the vertical position of the cursor line and a voltage of the vertical scanning signal VS coincide with each other, together with an adder 46 for adding the cursor signal CS to the image signal. The cursor signal CS is also supplied to the counter 42, and is used to control counting operation of the counter 42 for a horizontal scanning line corresponding to the cursor line. Therefore, only image signals at the display position of the cursor line are stored in the RAM 41.

Figure 5:
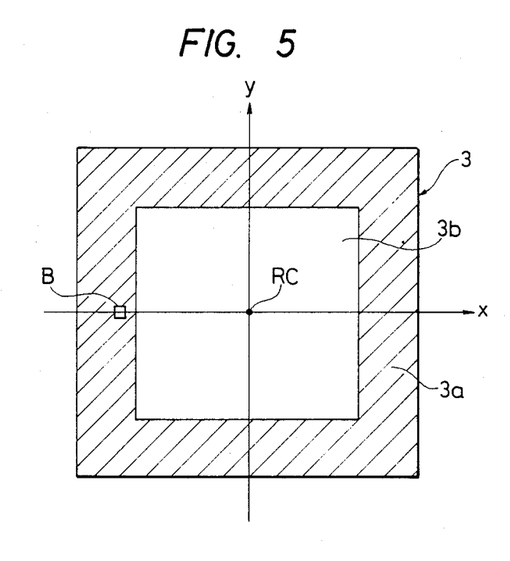
FIG. 5 is a plan view of a reticle.

FIG. 5 shows a reticle which is used for superposition exposure of a predetermined pattern (chip) on a wafer. A light-shielding portion 3a of a reticle 3 is formed by depositing a thin metal film of chromium or the like at the periphery of a rectangular glass plate. A desired circuit pattern is formed in an inner region 3b. When a center RC of the reticle 3 is defined as an origin O of the x-y coordinate system, a mark B for alignment along the x-direction is formed as a small rectangular opening. A mark for alignment along the y-direction is similarly formed on the y-axis. The mark B is observed through the reflecting mirror 14, the first objective lens 15, the second objective lens 16 and the ITV 21, as shown in FIG. 2. The reticle 3 is positioned such that the center RC coincides with the optical axis 9 of the projection lens 5.

The x-coordinate of the mark B is predetermined upon design of the reticle. Therefore, when the reticle is arranged as shown in FIG. 2 and the reflecting mirror 14 and the first objective lens 15 are moved along the optical axis 13, the mark B is observed through the ITV 21. The mark for alignment in the x-direction is similarly observed by another alignment optical system.

Figure 6:
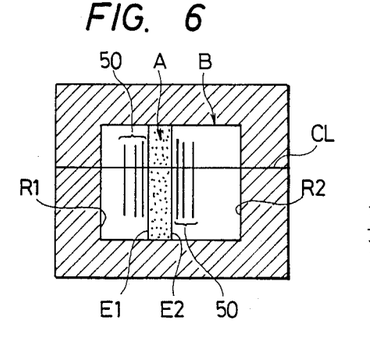
FIG. 6 is a view showing images of reference marks of a wafer and a reticle which are formed on an imaging surface.
Figure 7:
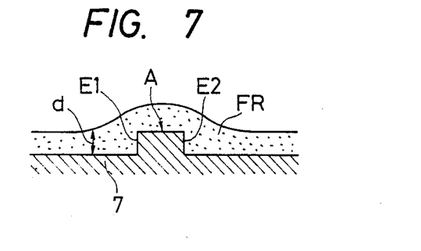
FIG. 7 is a sectional view of a wafer portion corresponding to the reference mark.
Figure 8:
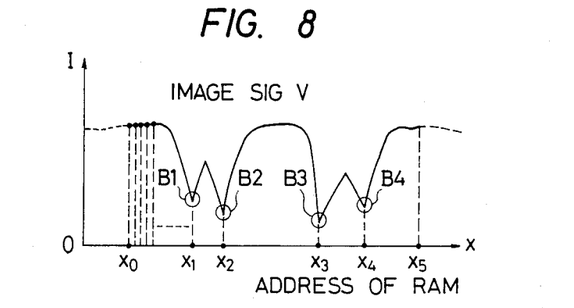
FIG. 8 shows a waveform of an image signal V.

The mode of operation of the apparatus will be described below. The wafer 7 is prealigned and placed on the stage 10. A process from a state wherein a chip on the wafer and the projection image of the pattern region 3b of the reticle are roughly aligned with each other to a state wherein they are precisely aligned will be explained. In the state wherein the chip and the projection image of the pattern region 3b are prealigned, illumination light from the light guide 20 is used to illuminate the marks B and A. Then, as shown in FIG. 6, images of the rectangular opening mark B and of the linear mark A are formed on the imaging surface 21a of the ITV 21. The images of the marks A and B are raster-scanned in a scanning region SA. At this time, a horizontal scanning line is substantially perpendicular to edges $E_1$ and $E_2$ at the two sides of the mark A, and edges $R_1$ and $R_2$ at the two sides of the mark B. Interference fringes 50 due to the influence of the photoresist appear parallel to the edges $E_1$ and $E_2$ and outside the edges $E_1$ and $E_2$. The interference fringes 50 are formed by irregular thickness of the photoresist layer. When, for example, the mark A is formed in a projecting state as shown in FIG. 7, thickness d of a photo-resist FR continuously changes near the edges $E_1$ and $E_2$ of the mark A. In the state shown in FIG. 6, the RAM 41 of the processor 30 samples and stores in units of pixels an image signal of one scanning line at a position where a cursor line CL is displayed. The obtained image signal V has an envelope as shown in FIG. 8 which has many peaks and bottoms (dips) in accordance with the mark A and the interference fringes 50. In practice, the image signal V includes components corresponding to the edges $R_1$ and $R_2$ of the mark B. In order to simplify the description, only the waveform portion from a position $x_0$ to position $x_5$, i.e., near the mark A is illustrated in FIG. 8. Of bottoms $B_1$, $B_2$, $B_3$ and $B_4$ of the image signal V, the bottoms $B_2$ and $B_3$ correspond to the edges $E_1$ and $E_2$ of the mark A, and the bottoms $B_1$ and $B_4$ correspond to the interference fringes 50.

Figure 9:
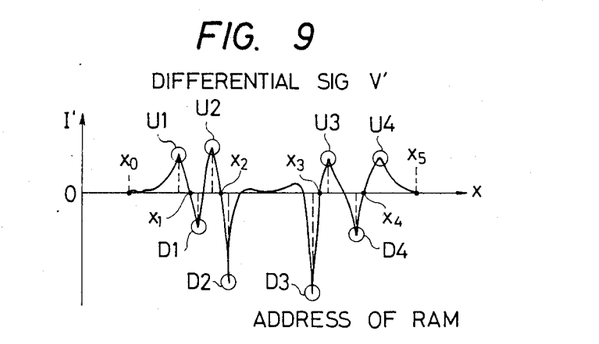
FIG. 9 shows a waveform of a differential signal V'.

Subsequently, the MPU 43 reads out the image signal V from the RAM 41, differentiates the image signal V from the position $x_0$ to the position $x_5$, and stores a differential signal V' in an empty area of the RAM 41 which has addresses corresponding to the x positions (coordinates). Differentiation of the image signal V is performed by calculating a rough central position (line of symmetry) of the waveform of the image signal V and then filtering with a numerical filter the signal from the central position to the left and right (in directions along which the address increases and decreases from the address corresponding to the central position of the RAM 41. The differential signal V' becomes zero at a characteristic waveform portion (peak or bottom) in the image signal V (the envelope is shown in FIG. 9), and includes many peaks $U_1$ to $U_4$ and bottoms $D_1$ to $D_4$.

Figure 10:
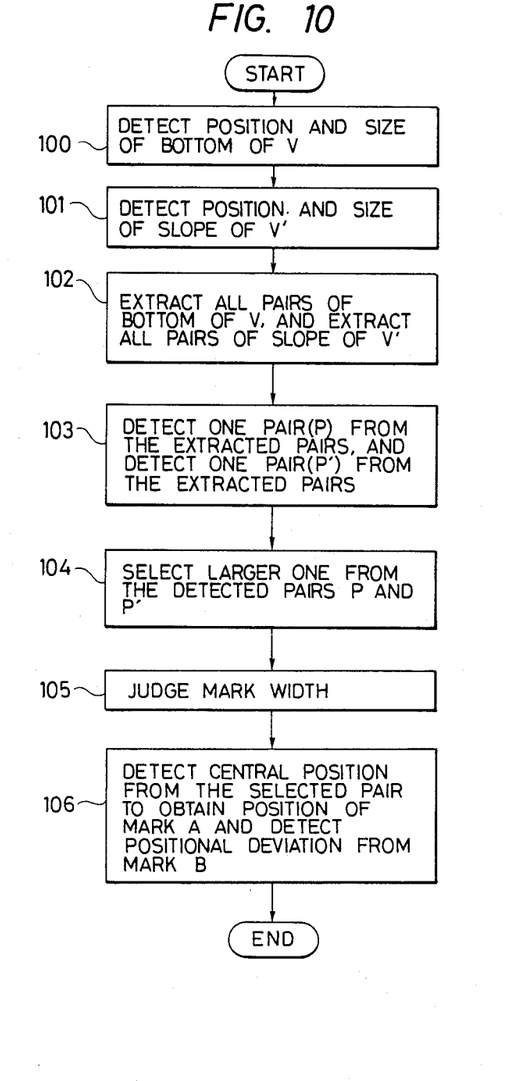
FIG. 10 is a flow chart for detection in the first embodiment of the present invention.

Subsequently, following the flow chart shown in FIG. 10, the MPU 43 detects the position of the mark A, i.e., the central position between the edges $E_1$ and $E_2$ along the x-direction in accordance with the image signal V stored in the RAM 41 and the differential signal V'. The flow chart shown in FIG. 10 shows a schematic function of the MPU 43. Steps 100 to 106 for performing this function will be described below.

Step 100

Figure 11:
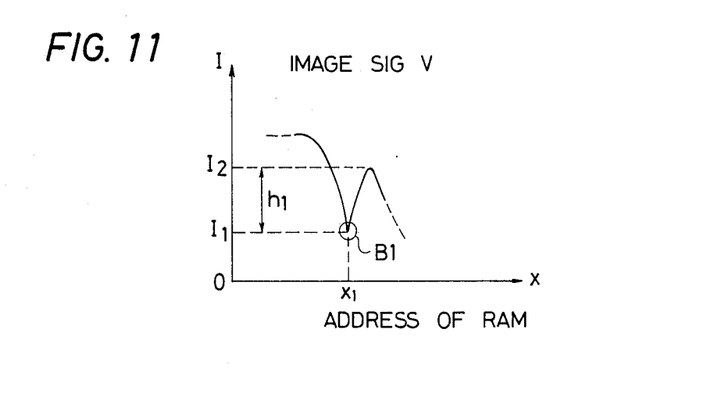
FIG. 11 shows a waveform of an image signal V.

The MPU 43 fetches the image signal V within a scanning range $x_0$ to $x_5$ from the RAM 41, detects positions $x_1$ to $x_4$ of the bottoms $B_1$ to $B_4$, and also detects magnitudes $h_1$, $h_2$, $h_3$, and $h_4$ of the respective bottoms. In order to detect the position of each bottom, a position at which a magnitude I' of the differential signal V' becomes zero is detected, and it is judged if the waveform portion of the image signal V corresponding to this zero-crossing is a dip. In order to detect the magnitude of the bottom, as shown in FIG. 11, after the bottom $B_1$, for example, is detected as the position $x_1$, the magnitude of the bottom $B_1$ is defined as $I_1$, and a magnitude I of the image signal V before and after the position $x_1$ is checked. Since the dip terminates at the position corresponding to the magnitude $I_2$, the MPU 43 stores the difference between the magnitudes $I_2$ and $I_1$ as the magnitude $h_1$ of the bottom $B_1$. In this manner, the MPU 43 detects the positions $x_1$, $x_2$, $x_3$, and $x_4$ of the bottoms $B_1$, $B_2$, $B_3$, and $B_4$, respectively, and magnitudes $h_1$, $h_2$, $h_3$, and $h_4$ of the respective bottoms, respectively, and stores the detected positions and magnitudes. The positions $x_1$ to $x_4$ are stored as the address of the RAM 41.

Step 101

The MPU 43 fetches the differential signal V' corresponding to the scanning range $x_0$ to $x_5$, and detects the position and size of a slope (inclined portion) of the differentiated waveform. In this embodiment, the positions of peaks and bottoms on the differentiated waveform are detected as the positions of the slope, and the size of the bottom is detected as the size of the slope. Alternatively, zero-crossings of the differentiated waveform can be detected as the positions of the slope, and the difference between the peak value and the bottom value of a single slope can be detected as the size of the slope. The MPU 43 detects four peak positions (addresses) $U_1$, $U_2$, $U_3$, and $U_4$ and four bottom positions (addresses) $D_1$, $D_2$, $D_3$, and $D_4$ from the differential signal V' shown in FIG. 9, and detects and stores magnitudes $l_1$, $l_2$, $l_3$, and $l_4$ of the respective bottoms. When the magnitudes of the bottoms on the differentiated waveform are detected as the magnitudes of the slope, the program for detecting the magnitudes of the bottoms in step 100 can also be used, thus rendering the program compact.

Step 102

The MPU 43 forms all the possible pairs of bottoms $B_1$ to $B_4$ on the waveform the image signal V.

In this case, six pairs of bottoms are obtained:
$(B_1, B_2), (B_1, B_3), (B_1, B_4), (B_2, B_3), (B_2, B_4),$ and $(B_3, B_4)$.

The MPU 43 then obtains all possible pairs of the peaks and of the bottoms, respectively, for the slope position on the waveform of the differentiated signal V', i.e., the peaks $U_1$ to $U_4$ and bottoms $D_1$ to $D_4$.

In this case, six pairs of peaks $(U_1, U_2), (U_1, U_3), (U_1, U_4), (U_2, U_3), (U_2, U_4),$ and $(U_3, U_4)$, and six pairs of bottoms $(D_1, D_2), (D_1, D_3), (D_1, D_4), (D_2, D_3), (D_2, D_4),$ and $(D_3, D_4)$ are obtained. This step corresponds to the first and second extraction portions 203 and 205 shown in FIG. 1.

Step 103

The MPU 43 selects one pair (P) which satisfies a predetermined discrimination standard from the six pairs extracted from the image signal V, thereby performing the operation corresponding to the first detect portion 207 shown in FIG. 1. In this embodiment, the MPU 43 performs a detection as to whether the interval between paired bottoms is approximately the same as the width of the mark A, and a detection as to symmetry by returning the image signal V.

First, it is detected if the interval between the positions $x_1$ and $x_2$ of the bottoms $B_1$ and $B_2$ is approximately the same as the width of the mark A for the pair ($B_1$, $B_2$). If not, a similar detection is performed as to the next pair ($B_1$, $B_3$). When it is determined that the interval for the pair ($B_1$, $B_3$) is approximately the same as the mark width, a detection as to the symmetry by returning is performed. In this case, the central position between the position $x_1$ of the bottom $B_1$ and the position $x_3$ of the bottom $B_3$ is determined, the image signal V is returned about this central position, and a correlation is calculated by correlation calculation. This operation is performed for all of the six pairs. Assume in this case that the pairs ($B_2$, $B_3$) and ($B_2$, $B_4$) are selected upon detection of the mark width, and the corresponding correlations are calculated. Then, the MPU 43 compares the correlations corresponding to the pairs ($B_1$, $B_3$), ($B_2$, $B_3$), and ($B_2$, $B_4$), and detects a pair having a highest correlation, e.g., the pair ($B_2$, $B_3$). When pattern matching is performed by returning the image signal, the entire image signal need not be returned. In this case, when the correlation of the pair ($B_1$, $B_3$) is calculated, the image signal need only be returned at the portion from the position $x_1$ to position $x_3$.

In this manner, the MPU 43 performs detection of the mark width and detection of symmetry for the six pairs of bottoms and the six pairs of bottoms extracted from the differential signal V' so as to detect one pair (P'), thereby performing the operation corresponding to the second detect portion 209 shown in FIG. 1. In this case, the mark width condition is satisfied for the pairs ($U_1$, $U_3$), ($U_2$, $U_3$) and ($U_2$, $U_4$), and a correlation is calculated for the pair ($U_1$, $U_3$) by returning the differential signal V' at the central position between the positions of the peaks $U_1$ and $U_3$. The MPU 43 detects a pair having a highest correlation, e.g., the pair ($U_2$, $U_3$) from the pairs ($U_1$, $U_3$), ($U_2$, $U_3$) and ($U_2$, $U_4$). Similarly, three pairs ($D_1$, $D_3$), ($D_2$, $D_3$) and ($D_2$, $D_4$) are selected upon detection of the mark width, and the pair ($D_2$, $D_3$) having a highest correlation is selected by detection of symmetry by returning the image signal.

Step 104

The MPU 43 then selects one of the pairs (P) and (P') which has the larger bottom or slope. In step 101, the magnitudes $l_1$, $l_2$, $l_3$ and $l_4$ of the bottoms $D_1$ to $D_4$ of the differential signal V' were detected. Therefore, in this step, for the pairs (P) and (P'), i.e., the pairs ($B_2$, $B_3$) and ($D_2$, $D_3$), the magnitudes $h_2$ and $h_3$ of the bottoms $B_2$ and $B_3$ and the magnitudes $l_2$ and $l_3$ of the bottoms $D_2$ and $D_3$ are compared so as to select a pair having larger magnitudes, e.g., the pair ($D_2$, $D_3$). This step corresponds to the operation of the second select portion 217 shown in FIG. 1.

Step 105

When the pair ($D_2$, $D_3$) is selected, the MPU 43 performs a detection based on a stricter condition than the mark width, i.e., a detection as to whether or not the selected pair nearly corresponds to the design width of the mark A. The pair ($D_2$, $D_3$) which has been selected by processing up to this step has a considerably high probability of corresponding to the two edges $E_1$ and $E_2$ of the mark A.

Step 106

The MPU 43 calculates the central position between the positions of the bottoms $D_2$ and $D_3$ of the pair ($D_2$, $D_3$) and detects the position of the central line between the edges $E_1$ and $E_2$ of the mark A along the scanning line (cursor line), thereby performing the operation corresponding to the calculate portion 219 shown in FIG. 1. Only the pixel (pixel position) of the scanning line from the scanning start pixel which corresponds to the center of the mark A need be detected. Also, the pixel positions of the edges $R_1$ and $R_2$ of the mark B of the reticle, and the pixel position at the center between the edges $R_1$ and $R_2$ are detected. The MPU 43 calculates the number of pixels corresponding to the difference between the pixel position at the center of the mark A and that of the mark B, and multiplies one pixel pitch on the wafer and the number of pixels so as to calculate the positional deviation of the mark A with respect to the mark B along the scanning line direction.

When the above steps are completed, one-dimensional positional deviation between the wafer and reticle is detected. The control circuit 31 shown in FIG. 3 operates together with the coordinate portion 39 to drive the motor 37 or 38 and to perform one-dimensional positioning of the stage 10. The processor 30 shown in FIG. 4 and the flow chart shown in FIG. 10 similarly function for the other alignment optical system so as to achieve two-dimensional alignment of the wafer and reticle. In this manner, since the projection image of the pattern region 3a and the chip on the wafer are correctly superposed, exposure light is radiated on the reticle and a desired pattern is transferred onto the wafer. When superposition exposure is to be performed for the next chip by the step and repeat method, alignment of the mark A of the next chip and the mark B of the reticle can be performed in exactly the same manner as that described above. Although high alignment precision can be obtained if the above alignment procedure is performed for all chips on a wafer, the alignment can be performed for one or a predetermined number of chips on the wafer and further alignment can be performed by the step and repeat method.

In step 102 of this embodiment, pairs of any two bottoms or peaks are prepared. However, the mark width detection can also be performed in this case so as to prepare only pairs of bottoms or peaks which have an interval approximately the same as the mark width. Depending upon the wafer process (etching or diffusion), the mark A may deform nonsymmetrically. In this case, the position of the mark A may be determined to a position shifted from the center in accordance with the nonsymmetrical deformation.

Figure 12:
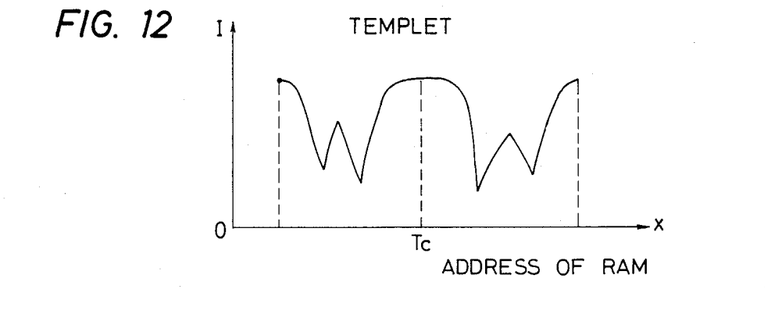
FIG. 12 shows a waveform of a templet.

In the above embodiment, symmetry is utilized in step 103. A modification will be described below with reference to FIG. 12 wherein templet matching is utilized. The templet stores a waveform of an image signal V of the mark A of the wafer. Note that the central position of the waveform of the mark A must be calculated in advance. When the templet is prepared in practice, image signals V of the marks A are extracted from the first wafer for each group of a plurality of wafers having the same base and pattern, i.e., each lot. In general, wafers in each lot are subjected to the same treatment. Therefore, thickness d of the photoresist is constant among the wafers of a single lot, and interference fringes will not largely deviate from one wafer to another. Based on this, for the first wafer of a lot, after a portion of the photoresist having a correctly determined thickness, e.g., a chip near the center of the wafer and the pattern region 3a are aligned by the stage, the mark A of the chip is detected. The characteristic waveform of the image signal V near the mark A as shown in FIG. 8 is stored as a templet in the RAM 41, as shown in FIG. 12. A central position (address) Tc of the mark A is also detected and stored in accordance with the flow chart shown in FIG. 10.

In the actual alignment process, three pairs ($B_1$, $B_3$), ($B_2$, $B_3$) and ($B_2$, $B_4$) which satisfy the condition of the mark width are selected in step 103 in the flow chart shown in FIG. 10. Thereafter, templet matching for each of the three pairs is performed. For the pair ($B_1$, $B_3$), the waveform of the image signal V and the templet are superposed such that the central position between the position $x_1$ of the bottom $B_1$ and the position $x_3$ of the bottom $B_3$ coincides with the central position Tc of the templet Tc, and a correlation is calculated. Correlations are similarly calculated for the remaining two pairs ($B_2$, $B_3$) and ($B_2$, $B_4$). When a pair having a highest correlation is selected, the objective pair ($B_2$, $B_3$) is determined. A templet can also be prepared for the waveform of a differentiated signal, and a single pair ($U_2$, $U_3$) and a single pair ($D_2$, $D_3$) can be detected by templet matching.

In the embodiment described above, both the image signal V and its differential signal V' are used. However, the central position between the edges of the mark A can be detected using only one of these signals.

Figure 13:
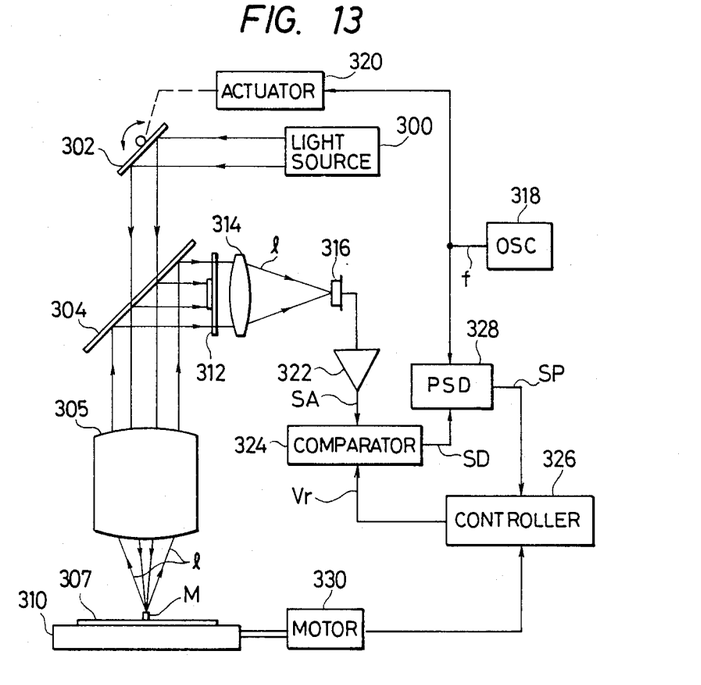
FIG. 13 is a diagram showing the schematic configuration of an alignment apparatus according to a second embodiment of the present invention.

FIG. 13 shows an alignment apparatus according to a second embodiment of the present invention. A beam spot as disclosed in U.S. Pat. No. 4,423,959 is utilized for scanning a reference mark, and a nonlinear amplifier or a waveform shaper are included in this embodiment for reducing distortion of a photoelectrically detected pattern signal due to deformation of the reference signal.

Collimated laser beams emitted by a light source 300 including a cylindrical lens are reflected by an oscillating mirror 302, passed through a beam splitter 304, and become incident on an objective lens 305. The laser beams focused by the objective lens 305 form a band-shaped beam spot on the surface of a wafer 307 by the function of the cylindrical lens. A diffraction grating mark M, for example, is formed on the wafer. The wafer is placed on a stage 310 which is two-dimensionally driven. When the mark M is irradiated with the beam spot, diffracted light l of first, second and higher orders and normally reflected light are obtained from the mark M. The diffracted light l and the normally reflected light are reflected by the beam splitter 304 through the objective lens 305 and become incident on a spatial filter 312. The spatial filter 312 has characteristics to cut off the normally reflected light but transmit the diffracted light l. A focusing lens 314 focuses only the filtered diffracted light onto the light-receiving surface of a photoelectric element 316. An oscillation signal f for oscillating the oscillating mirror 302 at a predetermined frequency is obtained from the oscillator 318. In response to the oscillation signal f, an actuator 320 oscillates the oscillating mirror 302 at that frequency. A galvanomirror and a torsional oscillator and the like are preferably used as the oscillating mirror 302 and the actuator 320. By means of the oscillating mirror, the photoelectric element 316 produces a modulated photoelectric signal. An amplifier 322 amplifies the photoelectric signal and supplies an amplified photoelectric signal SA to a comparator 324 as a nonlinear amplifier (or wave shaper). The comparator 324 compares the photoelectric signal SA with a predetermined reference voltage (threshold voltage) Vr supplied from a controller 326. The comparator 324 generates a time-serial binary signal SD which goes to logic level "1" when the photoelectric signal SA is larger than the reference voltage Vr. A phase sync detector (to be referred to as a PSD hereinafter) 328 as a wave detector rectifies (demodulates) the binary signal SD by an oscillation signal f, and generates a DC detection signal SP corresponding to the positional deviation between the oscillation center of the beam spot and the center of the mark M. The detection signal SP is a so-called S curve wherein the magnitude becomes zero when the oscillation center of the beam spot and the center of the mark M (center along the spot scanning direction) coincide with each other and the polarity is changed in accordance with the direction of the deviation with respect to the two centers. In response to the input detection signal SP, the controller 326 controls a motor 330 for driving the stage 310 so that the detection signal becomes zero. Although not shown, the PSD 328 includes an automatic gain control (AGC) circuit for receiving the binary signal SD, and a band-pass filter (or tuning amplifier) for selectively passing the fundamental frequency component of the gain-controlled binary signal, i.e., the frequency component which is the same as the oscillation signal f. The PSD 328 sync-detects the output signal from the band-pass filter by the oscillation signal f.

Figure 14:
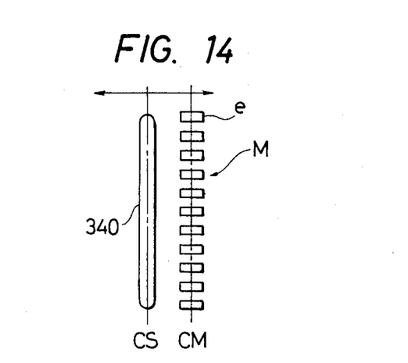
FIG. 14 is a plan view showing the positional relationship between a beam spot and a mark.
Figure 15A:
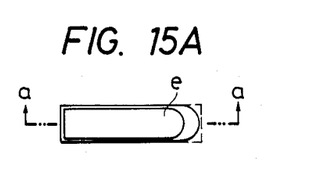
FIGS. 15A and 15B are a plan view and a sectional view of a grating element.
Figure 15B:
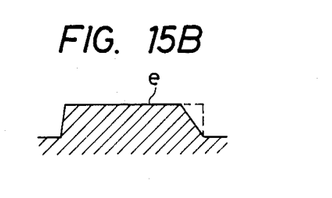
Figure 16:
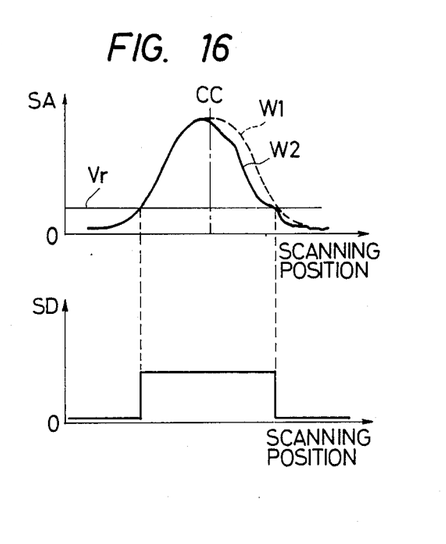
FIG. 16 shows waveforms of a photoelectric signal SA and a binary signal SD.

FIG. 14 shows the relationship between the beam spot on the wafer and the reference mark M in the apparatus of the configuration as described above. A beam spot 340 oscillates at a predetermined frequency within a range indicated by arrows. A center CS of the beam spot 340 along the widthwise direction is perpendicular to the oscillation scanning direction and is parallel to a central line CM of the mark M along the widthwise direction. The mark M consists of a plurality of small rectangular grating elements e arranged at a predetermined pitch along the central line CM. Each grating element e has a stepped edge which is perpendicular to the central line CM. When the beam spot 340 is overlapped on the mark M, diffracted light l is generated in a direction to spread in a plane including the central line CM perpendicular to the sheet of drawing. As shown in FIGS. 15A and 15B, each grating element e is formed as a projection on the surface of a wafer. Originally, the plan shape of the grating element e is rectangular but the right portion is sloped and the overall element is nonsymmetrically deformed due to influence of the formation process. If it is assumed that influence of the formation process for the overall mark M does not change locally, such deformation uniformly occurs in all the grating elements e of the mark M. In general, when a microprojection is formed, due to the influence of the formation process, the top edge portion is sloped and the bottom edge portion retains the original design shape. When a grating element is formed as a depression, the top edge portion generally retains the original shape. For this reason, when the beam spot 340 scans the mark M, the photoelectric signal SA has a waveform $W_2$ which is nonsymmetrical with respect to a center CC unlike a Gaussian waveform $W_1$ corresponding to the light intensity distribution along the oscillation scanning direction of the beam spot, as shown in FIG. 16. This means that nonsymmetrical distortion has occurred in the photoelectric signal SA due to nonsymmetry of the mark M along the scanning direction. When sync detection is performed using the photoelectric signal having the waveform $W_2$, the center of gravity of the waveform $W_2$ along the scanning direction is deviated from the original position, and the zero-crossings of the detection signal SP are also deviated accordingly. In contrast to this, at the bottom portion of the photoelectric signal SA corresponding to the bottom edge portion of the grating element e retaining the original shape, the obtained photoelectric signal SA has a waveform similar to the original waveform $W_1$. In view of this, according to this embodiment, the comparator 324 is used to digitize or quantize the bottom portion of the photoelectric signal SA by the reference signal Vr. This digitization shapes the binary signal SD, as shown in FIG. 16. The center of the width of logic level "1" interval of the binary signal SD coincides with the center CC of the original Gaussian waveform $W_1$. When digitization is performed at the bottom portion of the waveform of the photoelectric signal SA, even if the mark M has nonsymmetrical deformation, a signal portion corresponding to a symmetrical mark portion can be obtained.

The binary signal SD obtained in this manner is detected by the PSD 328, and the detection signal SP therefrom is used to control the motor 330 through the controller 326.

When the light intensity of the beam spot 340 is constant, the light intensity of the diffracted light l is also substantially constant and the magnitude of the waveform $W_1$ of the photoelectric signal SA does not fluctuate considerably. Therefore, the controller 326 will generate a constant reference voltage Vr which is not influenced by the distortion at the bottom portion of the photoelectric signal SA. However, in practice, the intensity of the diffracted light l fluctuates in accordance with the height (depth) of the step of the mark M, the thickness of the photoresist coated on the wafer surface, and the like. In view of this, the photoelectric signal SA is supplied to a peak-hold circuit so as to obtain a peak voltage of the photoelectric signal SA. The peak voltage is divided by a predetermined ratio, and the divided voltage is supplied to the comparator 324 as the reference voltage Vr. Note that the voltage dividing ratio is determined so as to remove the distorted portion of the waveform as described above. With this arrangement, even if the intensity of the diffracted light l from the mark M fluctuates, an optimal reference voltage Vr is automatically set and correct alignment can be performed.

When an operation means such as a microcomputer is included in the controller 326, the photoelectric signal SA can be converted into a digital signal by an analog-digital converter to store the wave shape, the distortion of the waveform is evaluated, and an optimal reference voltage Vr is supplied to the comparator 324.

Figure 17:
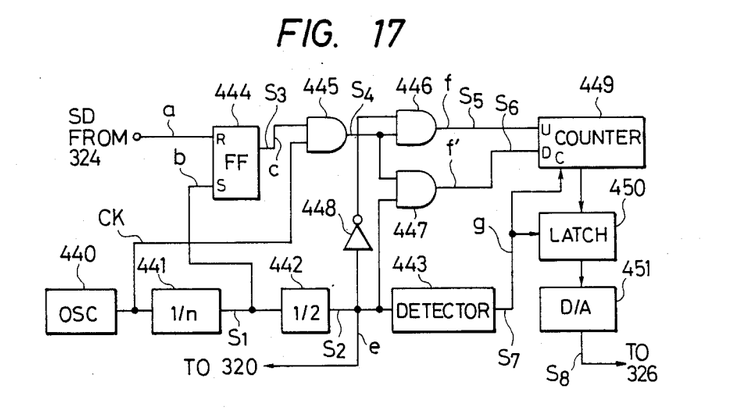
FIG. 17 is a block diagram of a detector according to a modification of the second embodiment of the present invention.

In an embodiment shown in FIG. 17, utilizing the fact that the photoelectric signal SA is converted to a digital signal by the comparator 324, the positional deviation of the mark M is detected by digital processing without using the PSD 328. A clock generator 440 generates a clock signal CK for measuring the phase shift amount of the binary signal SD. A frequency divider 441 generates a frequency divided signal $S_1$ obtained by frequency-dividing the clock signal at a ratio 1/n. A frequency divider 442 generates a frequency divided signal $S_2$ obtained by frequency-dividing the signal $S_1$ at a ratio ½. The signal $S_2$ is supplied to the actuator 320 shown in FIG. 13, and the oscillating mirror 302 oscillates at a frequency of the signal $S_2$. The binary signal SD from the comparator 324 is supplied to the reset input terminal of an RS flip-flop 444 of edge (leading edge) trigger type. The signal $S_1$ is supplied to the set input terminal of the flip-flop 444. An AND gate 445 receives an output signal $S_3$ from the flip-flop 444 and the clock signal CK. The AND gate 445 produces the clock signal CK only while the signal $S_3$ is at logic level "1". An output signal $S_4$ from the AND gate 445 is supplied to AND gates 446 and 447. The AND gate 446 calculates the logical AND product of the signal $S_4$ and the inverted signal of the signal $S_2$ by an inverter 448. The AND gate 447 calculates the logic AND product of the signal $S_2$ and the signal $S_4$. An up/down counter 449 counts up in response to an output signal $S_5$ from the AND gate 446 and counts down in response to an output signal $S_6$ from the AND gate 447. In response to the leading edge of the signal $S_2$, a detector 443 generates a pulse signal $S_7$ of a waveform the same as one pulse of the clock signal CK. The pulse signal $S_7$ is supplied as a clear pulse to the up/down counter 449 and clears as a clear pulse to the up/down counter 449 and clears the count of the counter 449 to zero at every period of the signal $S_2$, i.e., at every oscillation period of the beam spot 340. A digital latch 450 latches the count of the counter 449 in response to the pulse signal $S_7$. While the pulse signal $S_7$ is not being received, the latch 450 directly supplies the immediately preceding count. A digital-analog converter (to be referred to as DAC hereinafter) 451 converts the latched count to an analog signal $S_8$ including the polarity. The analog signal $S_8$ is equivalent to the detection signal SP in the embodiment shown in FIG. 13.

Figure 18:
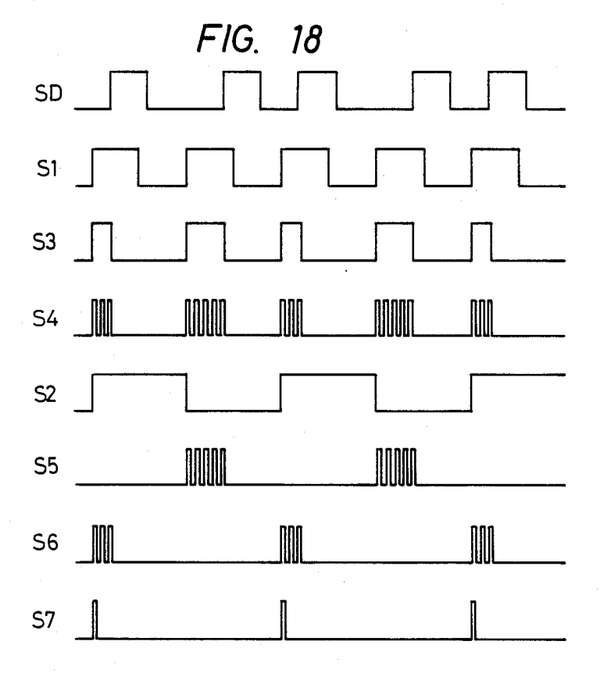
FIG. 18 is a timing chart in the circuit shown in FIG. 17.

The mode of operation of this embodiment will be described with reference to the timing chart shown in FIG. 18. FIG. 18 illustrates a case wherein the central line CM of the mark M is deviated from the oscillation center of the beam spot 340. For this reason, in the waveform of the binary signal SD, even if the width of logic level "1" interval corresponds to the width of the mark M, the width of logic level "0" interval includes long and short portions which alternately occur. When the width of logic level "0" interval becomes constant, it means that the central line CM of the mark M has coincided with the oscillation center of the beam spot. As can be seen from a comparison with the signal $S_2$, the binary signal SD has two logic level "1" intervals during one scanning of the beam spot 340. Therefore, the output signal $S_3$ of the RS flip-flop 444 has a waveform wherein two logic level "1" intervals having different widths alternate. Meanwhile, the AND gate 446 passes the signal $S_4$ only while the signal $S_2$ is at logic level "0". Therefore, the output signal $S_5$ has a repetitive waveform including clock pulses of the clock signal CK which correspond in number to those interpolated in the logic level "1" interval of the signal $S_3$ having a larger width. Since the AND gate 447 passes the signal $S_4$ only while the signal $S_2$ is at logic level "1", the output signal $S_6$ has a repetitive waveform including clock pulses of the clock signal CK which correspond in number to those interpolated in the logic level "1" interval having a smaller width. In response to the leading edge of the signal $S_2$, the pulse signal $S_7$ clears the counter 449. Therefore, immediately after the clear operation, the counter 449 counts down the clock pulses of the signal $S_6$ and thereafter counts up the clock pulses of the signal $S_5$. In this case, since the number of clock pulses of the signal $S_5$ is larger than that of clock pulses of the signal $S_6$, the count is positive and its absolute value corresponds to the positional deviation between the central line CM of the mark M and the oscillation center of the beam spot. When one scanning period of the beam spot is terminated in this manner and the next pulse signal $S_7$ is generated, the count is latched in the latch 450, and the counter 449 is cleared to zero. The above operation is repeatedly performed for each period of the beam spot. Therefore, the output signal $S_8$ of the DAC 451 has an absolute analog value having the positive polarity and corresponding to the positional deviation. The output signal $S_8$ is used for control of the motor 330 through the controller 326 in the same manner as the detection signal SP.

The DAC 451 in this embodiment is not always necessary. When a microcomputer or the like is used for the controller 326 and the motor 330 is controlled by digital servo control, the latch output from the latch 450 can be directly supplied to the controller 326. Furthermore, as in this embodiment, when the positional deviation between the center of the mark M and the oscillation center of the beam spot is detected in accordance with the count of the clock signal CK by the counter 449, in order to improve detection resolution, the frequency of the clock signal CK is increased and the frequency division ratio n of the frequency divider 441 is increased. The oscillating mirror 302 or the like is preferably oscillated at an inherent resonant frequency (about 2 to 3 KHz) or at a frequency close to it in order to obtain stable magnitude. Therefore, the frequency of the signal $S_2$ is set to be the resonant frequency or a frequency close thereto. Furthermore, in this embodiment, a digital value corresponding to the positional deviation between the center of the mark M and the oscillation center of the beam spot is obtained by the latch 450. Therefore, when the position of e.g., the stage 310 is measured by a laser interferometer, correspondence between the count of a digital counter of the laser interferometer and the digital value of the latch 450 can be established in accordance with the counting resolution (length corresponding to one-digit change). More specifically, assume that the mark M and the beam spot are deviated from each other by ±1 μm, and the digital counter of the laser interferometer changes by one digit per 0.02 μm displacement. In this case, the clock signal CK, the frequency-division ratio n and the like are determined such that the count of the latch is ±50 (1/0.02) in decimal notation. With this method, when the count of the latch is substracted from the present count of the digital counter of the laser interferometer (or added thereto), the position of the stage to be positioned can be immediately calculated. However, in practice, since the beam spot oscillates sinusoidally, the digital value of the latch has an inverse trigonometric function with respect to position. When the digital value is converted by this function, it has a linear relationship with position. This conversion is not necessary when only approximate position must be detected.

Figure 19A:
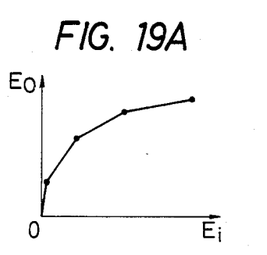
FIGS. 19A, 19B, and 19C are graphs showing input/output characteristics of nonlinear amplifiers, respectively.
Figure 19B:
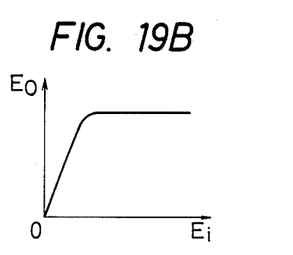
Figure 19C:
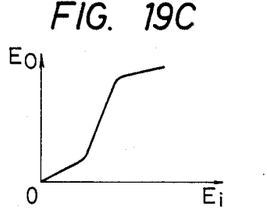

In each embodiment described above, a comparator is used as a nonlinear amplifier. However, depending upon the distortion of the waveform of the photoelectric signal SA, a polygonal approximation amplifier, a logarithmic amplifier, or a limiter amplifier (with a function equivalent to the comparator) having a high-gain linear operation region, or a combination thereof with a comparator can be used. FIG. 19A shows the input/output characteristics (Eo/Ei) of a polygonal approximation amplifier, and FIG. 19B shows the input/output characteristics (Eo/Ei) of a limiter amplifier. In either case, a bottom portion of the waveform of the photoelectric signal SA is emphasized, and a portion which is easily subject to nonsymmetry is suppressed. FIG. 19C shows input/output characteristics of another polygonal approximation amplifier, wherein a central portion of the waveform is emphasized. When sync detection is performed as in the case of the embodiment shown in FIG. 13, a polygonal approximation amplifier, a logarithmic amplifier or a limiter amplifier as described above can be used in place of the comparator 324. In this case, the compensation degree for waveform distortion of the photoelectric signal SA due to nonsymmetrical distortion of the mark M is determined in accordance with the input/output characteristics of the amplifier used, and the position detection precision of the mark M is accordingly improved. If a comparator is connected to a stage after such an amplifier, a still better effect is obtained. In this case, when an amplifier having the characteristics as shown in FIG. 19C is used, the threshold voltage is set to coincide with the central portion of the waveform. This is to allow digitization at the threshold level corresponding to the central portion close to the mark width in order to eliminate adverse effects of an unstable bottom portion (noise-like waveform) of the waveform of the photoelectric signal caused by Al microparticles when a thin Al film is formed on a wafer surface. When an amplifier as described above is used, in the same manner as that in changing the threshold voltage of the comparator, the waveform of the photoelectric signal SA can be evaluated, and an offset voltage corresponding to the distortion is added to the photoelectric signal and then the obtained signal is supplied to the amplifier. Alternatively, the input/output characteristic (Eo/Ei) curve can be changed in accordance with distortion.

In the above embodiments, when the mark M comprises a single linear pattern, of two linear side stepped edges, only one edge is deformed in the formation process. However, even in this case, the central position between the two edges can be correctly detected. In order to allow scanning of the mark M with the beam spot, the stage can be moved relative to the beam spot which is kept stationary. Instead of oscillation scanning, a pin hole or a slit can be exposed in place of a beam spot of a laser, and an image thereof can be projected onto a wafer.

We claim:

1. An apparatus for detecting a position of a substrate on which a reference pattern is formed, the reference pattern having at least two opposing edges and a plurality of grating elements arranged at a predetermined pitch along the two edges, comprising:

means for supplying a spot of a light beam onto said substrate;

means for scanning the reference pattern by said spot along a scanning line crossing the two edges;

means for receiving a part of the light beam diffracted by said edges and generating a time-serial output signal corresponding to the reference pattern on the scanning line, the output signal having an output waveform including two bottom portions respectively corresponding to the two edges and a peak between the bottom portions;

means for amplifying the output signal and having a nonlinear amplification characteristic wherein a gain at the bottom portions is larger than that at the peak;

means for adjusting said amplification characteristic on the basis of an evaluation of the output waveform; and means for detecting the position of the reference pattern with respect to the scanning line from the output signal amplified by said amplifying means, wherein said position is determined at the center of the interval between said two bottom portions.

2. An apparatus according to claim 1, wherein said adjusting means determines said amplification characteristic on the basis of an amount of the peak of the output waveform.

3. An apparatus according to claim 1, wherein said adjusting means determines said amplification characteristic on the basis of the distortion of the output waveform.

4. An apparatus for detecting a position of a substrate on which a reference pattern is formed, the reference pattern having at least two opposing edges and a plurality of grating elements arranged at a predetermined pitch along the two edges, comprising:

means for supplying a spot of a light beam onto said substrate;

means for scanning the reference pattern by said spot along a scanning line crossing the two edges;

means for receiving a part of the light beam diffracted by said edges and generating a time-serial output signal corresponding to the reference pattern on the scanning line, the output signal having an output waveform including two bottom portions respectively corresponding to the two edges and a peak between the bottom portions;

means for digitizing the output signal at a threshold level corresponding to said bottom portions of the output waveform;

means for adjusting said threshold level on the basis of the output waveform; and means for detecting the position of the reference pattern with respect to the scanning line from the output signal digitized by said digitizing means, wherein said position is determined at the center of the interval between said two bottom portions.

5. An apparatus according to claim 4, wherein said adjusting means determines said threshold level on the basis of an amount of the peak of the output waveform.

6. An apparatus according to claim 4, wherein said adjusting means determines said threshold level on the basis of the distortion of the output waveform.

7. An apparatus according to claim 4, wherein said scanning means includes means for oscillating said spot at a predetermined period; said receiving means generates the output signal modulated by the oscillation period of the spot; and said detecting means includes means for demodulating the digitized output signal at the oscillation period and for generating a detection signal corresponding to a positional deviation between an oscillation center of the light beam and the reference pattern.

* * * * *